United States Patent
Miura et al.

(10) Patent No.: US 8,222,649 B2
(45) Date of Patent: Jul. 17, 2012

(54) SEMICONDUCTOR DEVICE AND METHOD OF MANUFACTURING THE SAME

(75) Inventors: Naruhisa Miura, Chiyoda-ku (JP);
Keiko Fujihira, Chiyoda-ku (JP);
Kenichi Otsuka, Chiyoda-ku (JP);
Masayuki Imaizumi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 713 days.

(21) Appl. No.: 12/161,592

(22) PCT Filed: Nov. 17, 2006

(86) PCT No.: PCT/JP2006/322954
§ 371 (c)(1),
(2), (4) Date: Jul. 21, 2008

(87) PCT Pub. No.: WO2007/091360
PCT Pub. Date: Aug. 16, 2007

(65) Prior Publication Data
US 2010/0219417 A1   Sep. 2, 2010

(30) Foreign Application Priority Data
Feb. 7, 2006   (JP) ................................ 2006-029254

(51) Int. Cl.
*H01L 29/161* (2006.01)
*H01L 29/167* (2006.01)
*H01L 21/36* (2006.01)

(52) U.S. Cl. .......... 257/77; 257/134; 257/135; 257/262; 257/287; 257/345; 257/404; 257/E29.104

(58) Field of Classification Search ............... 257/77, 257/134, 135, 262, 287, 327–346, 404, 496, 257/E29.104
See application file for complete search history.

(56) References Cited

U.S. PATENT DOCUMENTS

| 5,016,066 A | 5/1991 | Takahashi |
| 5,637,898 A * | 6/1997 | Baliga ............................ 257/330 |
| 6,313,482 B1 * | 11/2001 | Baliga ............................ 257/77 |

(Continued)

FOREIGN PATENT DOCUMENTS

| JP | 59 167066 | 9/1984 |
| JP | 64 57675 | 3/1989 |
| JP | 1-253966 | 10/1989 |
| JP | 6-5867 | 1/1994 |
| JP | 6 338616 | 12/1994 |
| JP | 9-129874 | 5/1997 |
| JP | 9-326486 | 12/1997 |
| JP | 2000 507394 | 6/2000 |
| JP | 2000 286415 | 10/2000 |

(Continued)

OTHER PUBLICATIONS

U.S. Appl. No. 13/146,654, filed Jul. 28, 2011, Miura, et al.

*Primary Examiner* — Kiesha Bryant
*Assistant Examiner* — Eric Ward
(74) *Attorney, Agent, or Firm* — Oblon, Spivak, McClelland, Maier & Neustadt, L.L.P.

(57) ABSTRACT

A semiconductor device and a method of manufacturing the same, to appropriately determine an impurity concentration distribution of a field relieving region and reduce an ON-resistance. The semiconductor device includes a substrate, a first drift layer, a second drift layer, a first well region, a second well region, a current control region, and a field relieving region. The first well region is disposed continuously from an end portion adjacent to the vicinity of outer peripheral portion of the second drift layer to a portion of the first drift layer below the vicinity of outer peripheral portion. The field relieving region is so disposed in the first drift layer as to be adjacent to the first well region.

9 Claims, 8 Drawing Sheets

U.S. PATENT DOCUMENTS

| | | | |
|---|---|---|---|
| 6,429,041 B1 * | 8/2002 | Ryu et al. | 438/105 |
| 6,495,871 B2 | 12/2002 | Hattori et al. | |
| 6,956,238 B2 * | 10/2005 | Ryu et al. | 257/77 |
| 7,345,309 B2 * | 3/2008 | Zhang et al. | 257/77 |
| 7,399,676 B2 * | 7/2008 | Kumar et al. | 438/268 |
| 7,928,469 B2 * | 4/2011 | Fujihira et al. | 257/134 |
| 2002/0063300 A1 * | 5/2002 | Miyajima | 257/409 |
| 2004/0119076 A1 * | 6/2004 | Ryu | 257/77 |
| 2007/0145377 A1 | 6/2007 | Miura | |

FOREIGN PATENT DOCUMENTS

| | | |
|---|---|---|
| JP | 2001-250947 | 9/2001 |
| JP | 2002 164541 | 6/2002 |
| JP | 2002-270839 | 9/2002 |
| JP | 2003 124208 | 4/2003 |
| JP | 2003-273127 | 9/2003 |
| JP | 2005 5578 | 1/2005 |
| WO | WO 2005/083796 A1 | 9/2005 |

\* cited by examiner

F I G . 3
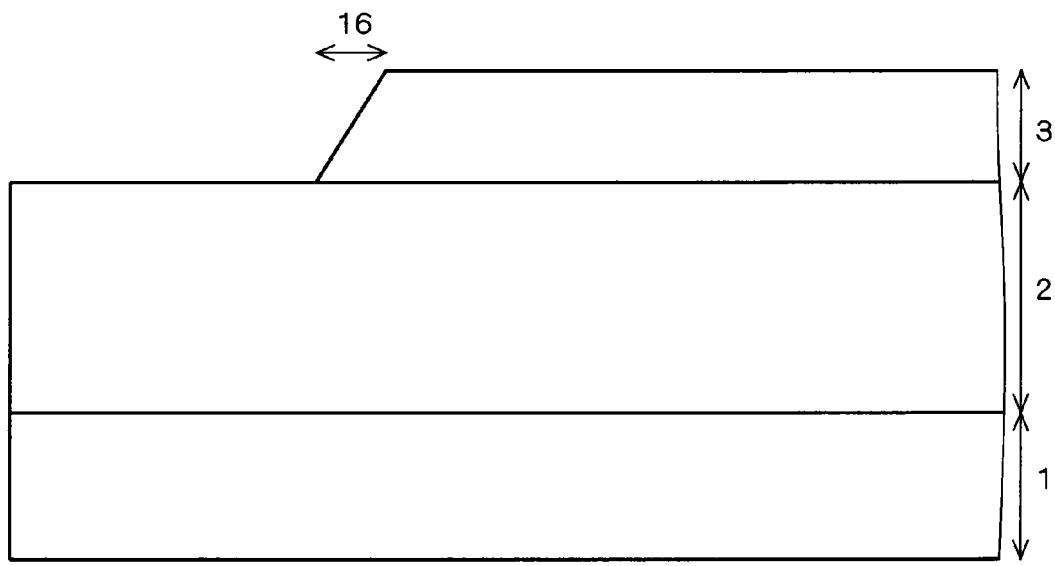
F I G . 4
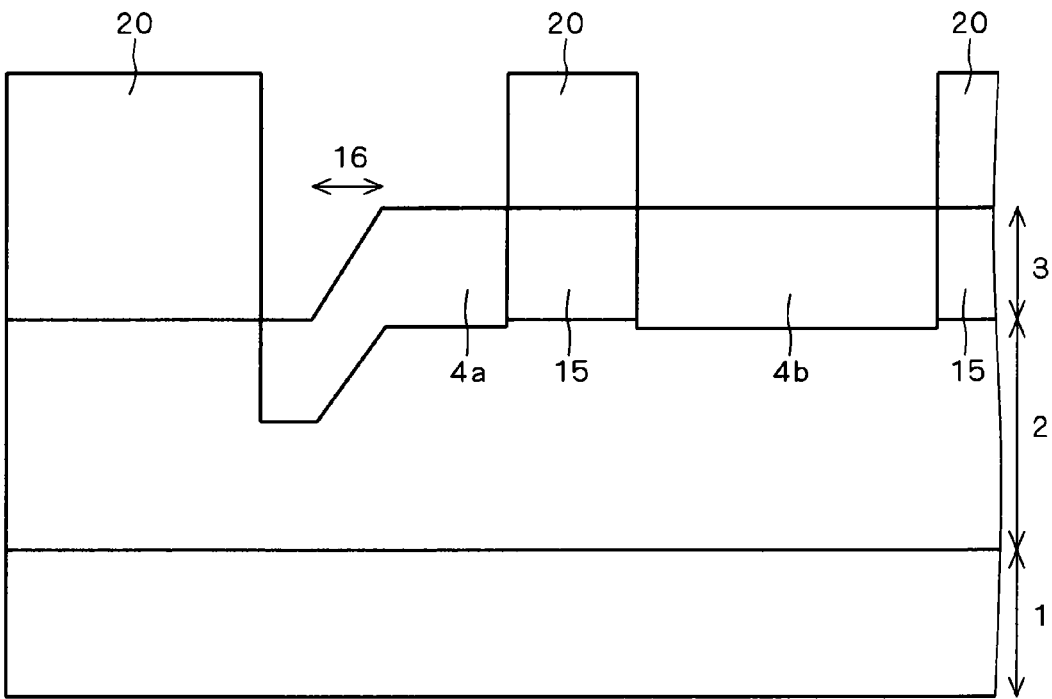

F I G . 9
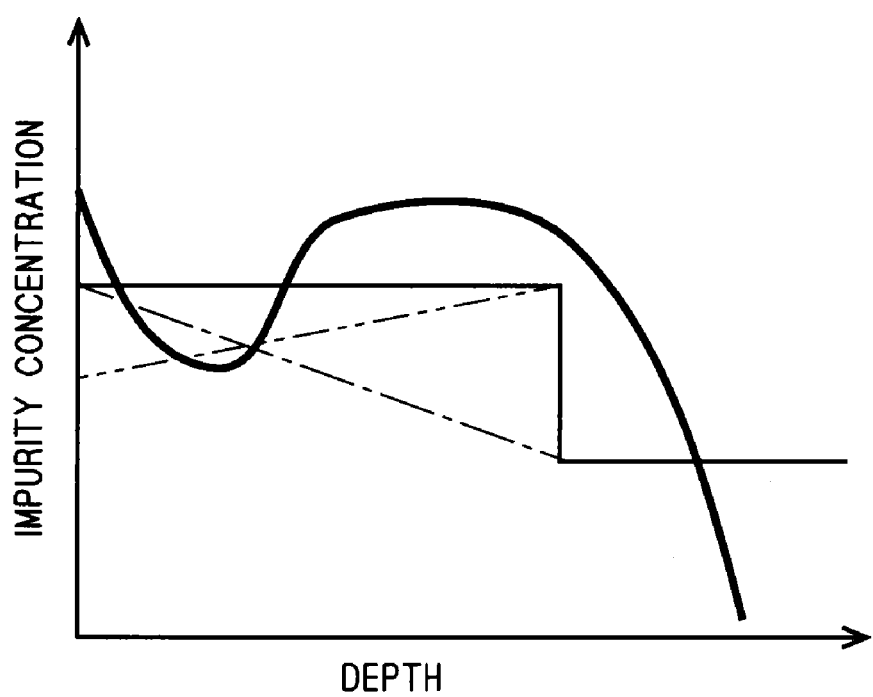

F I G . 1 2
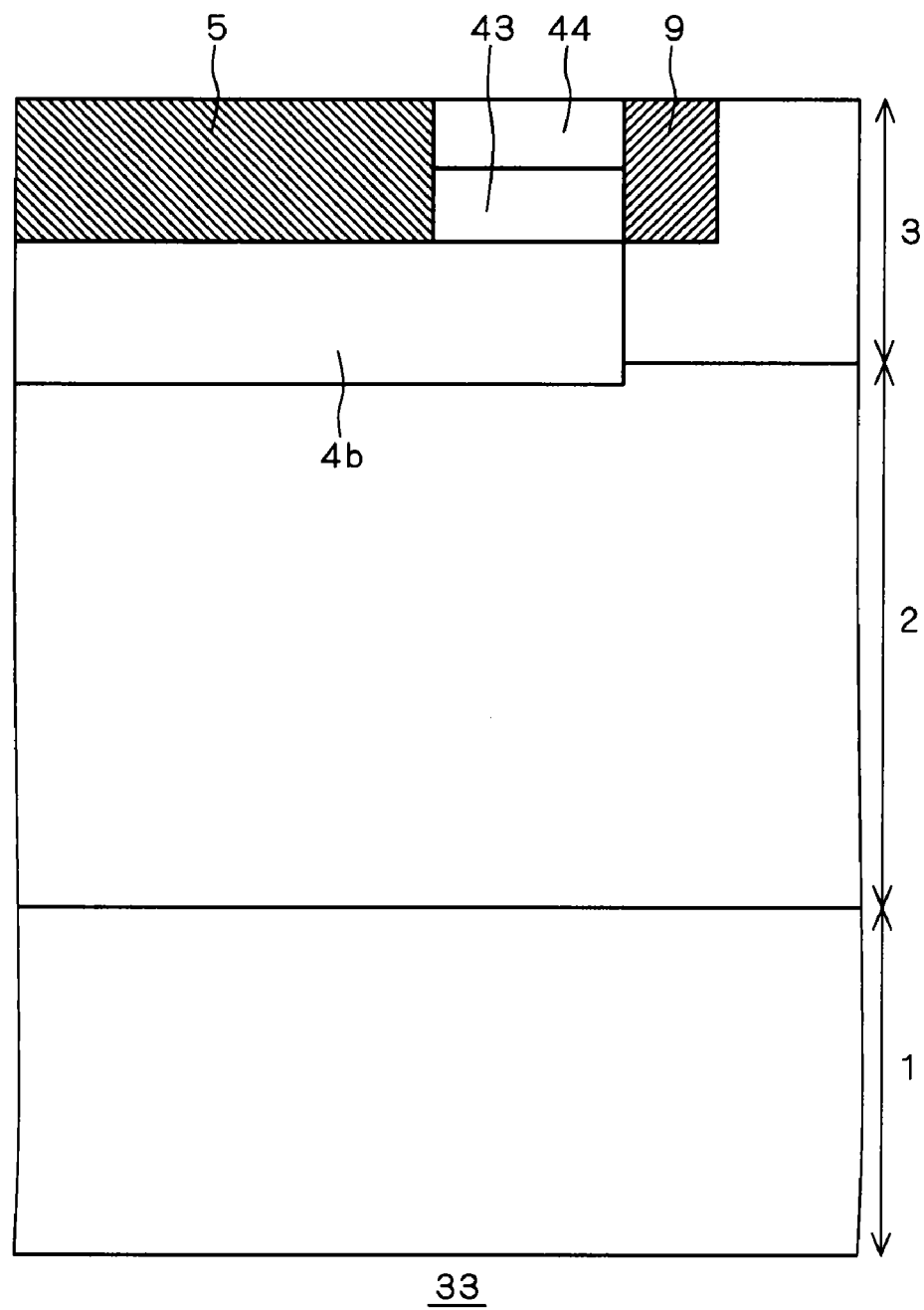

SEMICONDUCTOR DEVICE AND METHOD OF MANUFACTURING THE SAME

TECHNICAL FIELD

The present invention relates to a semiconductor device and a method of manufacturing the same, and more particularly to a technique for reducing an ON-resistance to achieve higher performance in a silicon carbide field effect transistor.

BACKGROUND ART

As a next-generation high breakdown voltage low loss switching element, there is hope for a vertical high breakdown voltage silicon carbide field effect transistor. This element, as shown in e.g., Patent Document 1, comprises well regions formed by a photolithography technique and an ion implantation technique, in a drift layer (second epi layer) existing on a silicon carbide substrate, in the vicinity of a surface of the substrate, a source region and a JFET region (current control region) existing below a gate electrode, being sandwiched between the pair of well regions.

Though one of means for improving the performance of the silicon carbide semiconductor device, especially the vertical high breakdown voltage silicon carbide field effect transistor, is miniaturization (e.g., reduction of cell pitch), it is preferable herein to also reduce the JFET length (the spacing between the pair of well regions below the gate electrode). With miniaturization, however, since the resistance of the JFET region which is fundamentally high sharply increases to raise the ON-resistance of the element, the drain current at ON operation decreases and this makes it impossible to improve the performance. Therefore, in order to achieve higher performance of this element, it is necessary to reduce the ON-resistance.

Among methods of reducing the ON-resistance are a method disclosed in Patent Documents 1 and 2 in which a double-layer structure consisting of drift layers having different impurity concentrations and a method disclosed in Patent Document 2 in which a current induction layer is provided in the JFET region.

Patent Document 1: Japanese Patent Application Laid Open Gazette No. 2000-286415
Patent Document 2: Japanese Patent Application Laid Open Gazette No. 2005-5578

In the high breakdown voltage low loss switching element, it is necessary to provide a field relieving region (JTE region) for relieving an electric field in a region in the vicinity of outer peripheral portion of a drift layer. When the impurity concentration of the drift layer is increased, however, in order to reduce the ON-resistance, the impurity of the drift layer affects the impurity concentration of the field relieving region. Therefore, it disadvantageously becomes difficult to appropriately determine an impurity concentration distribution of the field relieving region.

DISCLOSURE OF INVENTION

The present invention is intended to solve the above problem, and it is an object of the present invention to provide a semiconductor device which is capable of appropriately determine an impurity concentration distribution of a field relieving region and reducing an ON-resistance, and a method of manufacturing the same.

The semiconductor device according to a first aspect of the present invention includes a substrate, a first drift layer, a second drift layer, a first well region, a second well region, a current control region and a field relieving region. The substrate is formed of silicon carbide including a first conductivity type impurity. The first drift layer is formed of silicon carbide including a first conductivity type impurity of first concentration, being disposed entirely on a surface of the substrate. The second drift layer is formed of silicon carbide including a first conductivity type impurity of second concentration higher than the first concentration, being disposed entirely on a surface of the first drift layer except its vicinity of outer peripheral portion. The first well region contains a second conductivity type impurity, being disposed continuously from an end portion adjacent to the vicinity of outer peripheral portion of the second drift layer to a portion of the first drift layer below the vicinity of outer peripheral portion. The second well region contains the second conductivity type impurity, being disposed in the second drift layer except the end portion adjacent to the vicinity of outer peripheral portion. The current control region is disposed in second drift layer between the first and second well regions. The field relieving region is so disposed in the first drift layer as to be adjacent to the first well region.

According to the first aspect of the present invention, the semiconductor device can reduce a resistance in the field relieving region.

Further, it is possible to appropriately determine an impurity concentration distribution of the field relieving region without being affected by the second drift layer.

A method of manufacturing a semiconductor device according to a first aspect of the present invention includes a step of preparing a substrate, a step of forming a first drift layer, a step of forming a second drift layer, a step of removing the vicinity of outer peripheral portion of the second drift layer, a current control region providing step and a step of forming a field relieving region. The substrate is formed of silicon carbide including a first conductivity type impurity. The first drift layer is made of silicon carbide including a first conductivity type impurity of first concentration and formed entirely on a surface of the substrate by epitaxial growth. The second drift layer is made of silicon carbide including a first conductivity type impurity of second concentration higher than the first concentration and formed entirely on a surface of the first drift layer by epitaxial growth. The current control region providing step is to form a first well region at an end portion adjacent to the vicinity of outer peripheral portion of the second drift layer and in a portion of the first drift layer below the vicinity of outer peripheral portion and to form a second well region in the second drift layer except the end portion adjacent to the vicinity of outer peripheral portion by selectively implanting a second conductivity type impurity, to thereby determine the second drift layer between the first and second well regions as a current control region. A field relieving region is so formed in the first drift layer as to be adjacent to the first well region.

According to the first aspect of the present invention, the method of manufacturing a semiconductor device can reduce a resistance in the field relieving region.

Further, it is possible to appropriately determine an impurity concentration distribution of the field relieving region without being affected by the second drift layer.

BRIEF DESCRIPTION OF DRAWINGS

FIG. 3 is a cross section showing a method of manufacturing the semiconductor device in accordance with the first preferred embodiment;

FIG. 4 is a cross section showing a method of manufacturing the semiconductor device in accordance with the first preferred embodiment;

FIG. 9 is a graph showing an impurity concentration distribution in the depth direction of the semiconductor device in accordance with the second preferred embodiment;

FIG. 12 is a cross section showing a structure of a buried field effect transistor in accordance with the second preferred embodiment.

BEST MODE FOR CARRYING OUT THE INVENTION

The First Preferred Embodiment

Figure 1:
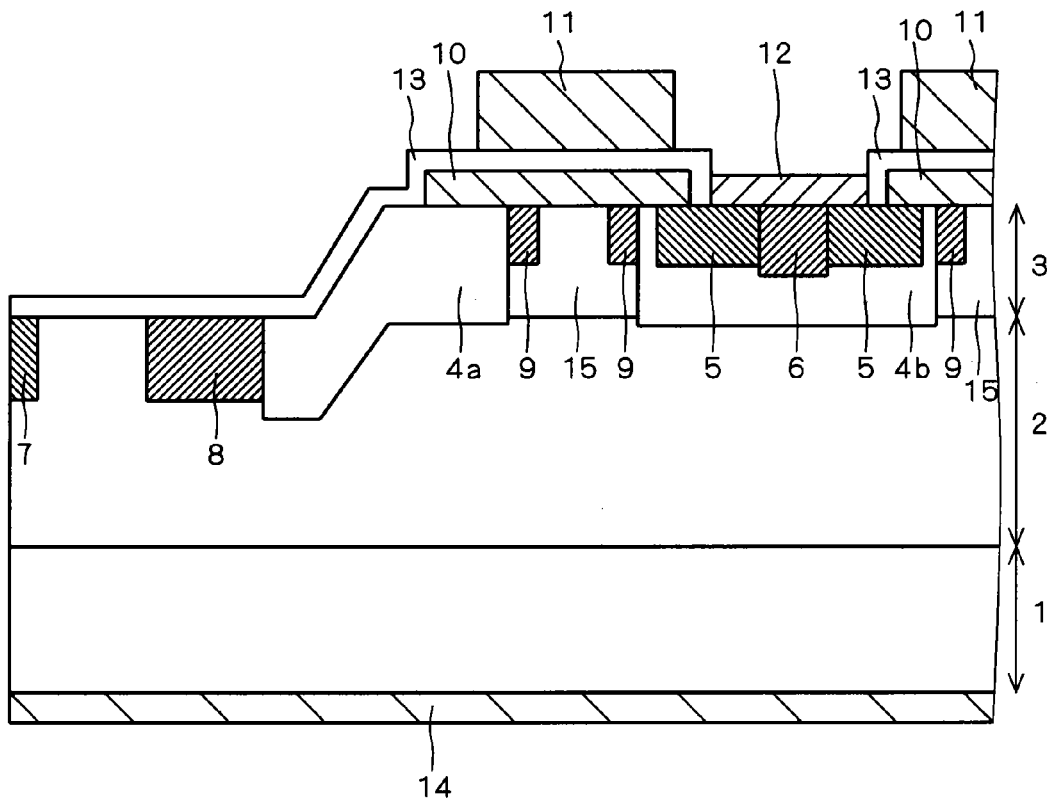
FIG. 1 is a cross section showing a structure of a semiconductor device in accordance with a first preferred embodiment.

FIG. 1 is a cross section showing a structure of a semiconductor device (field effect transistor as a switching element) in accordance with the first preferred embodiment. In FIG. 1, only the vicinity of outer peripheral portion of a substrate is shown and the vicinity of inner portion of the substrate is not shown. In other words, in FIG. 1, the left side corresponds to the outer peripheral side and the right side corresponds to the inner side.

In FIG. 1, entirely on a surface of a substrate 1 formed of silicon carbide including a first conductivity type impurity, a first drift layer 2 formed of silicon carbide including the first conductivity type impurity is formed. On a surface of the first drift layer 2, a second drift layer 3 formed of silicon carbide including the first conductivity type impurity is entirely formed except the vicinity of outer peripheral portion. The concentration (second concentration) of the first conductivity type impurity contained in the second drift layer 3 is higher than the concentration (first concentration) of the first conductivity type impurity contained in the first drift layer 2.

A well region 4a (first well region) is formed continuously from an end portion adjacent to the vicinity of outer peripheral portion of the second drift layer 3 to a portion of the first drift layer 2 below the vicinity of outer peripheral portion. A JFET (Junction Field Effect Transistor) region 15 is so formed in the second drift layer 3 as to be adjacent to the well region 4a, and a well region 4b (second well region) is so formed as to be adjacent to the JFET region 15. In other words, the JFET region 15 is formed between the well regions 4a and 4b. These well regions 4a and 4b are formed by selectively implanting a second conductivity type impurity of predetermined concentration (third concentration) into the first drift layer 2 and the second drift layer 3. Hereinafter, the well regions 4a and 4b are generally termed "well region 4" simply. The JFET region 15 serves as a current control region for controlling a drain current flowing in the switching element at ON operation by a gate electrode 11 disposed above and is depleted at OFF operation to have a function to relieve the electric effect across a gate insulating film 13.

On a surface of the second drift layer 3, an extension region 9 is formed at each of respective interfaces between the JFET region 15 and the well regions 4a and 4b. The extension region 9 is so formed as to be shallower than the JFET region 15 and the well regions 4a and 4b. The concentration (fourth concentration) of the first conductivity type impurity contained in the extension region 9 is higher than the concentration (second concentration) of the first conductivity type impurity contained in the second drift layer 3.

On the JFET region 15, the gate electrode 11 is formed with an epitaxial channel region 10 and the gate insulating film 13 interposed therebetween. In the well region 4b, a source region 5 of the first conductivity type and a well contact region 6 of the second conductivity type are formed, and on these regions, a source electrode 12 is formed. Further, in the first drift layer 2, a JTE (Junction Termination Extension) region (guard ring region) 8 is so formed outside the well region 4a as to be adjacent to the well region 4a. The JTE region 8 serves as a field relieving region for relieving the electric field in the vicinity of outer peripheral portion. Further, in the first drift layer 2, a field stopper region 7 of the first conductivity type is so formed away from the JTE region 8 as to come into contact with the outer peripheral portion. Entirely on a back surface of the substrate 1, a drain electrode 14 is formed.

Though the vicinity of inner portion of the substrate 1 is not shown in FIG. 1 as discussed above, actually, a plurality of pairs of JFET regions 15 and well regions 4b as shown in FIG. 1 are repeatedly formed toward the inner portion of the substrate 1. In other words, the well region 4a is formed only in a portion closest to the outer peripheral portion and the well regions 4b are formed on the inner side.

Further, though discussion will be made hereinafter, taking an exemplary case where the first conductivity type is n type and the second conductivity type is p type, since it is preferable that the conductivity type of the substrate 1 should be n type in the semiconductor device of the present invention, the combination of the conductivity types in the semiconductor device is not limited to the above case but there may be a case where the first conductivity type is p type and the second conductivity type is n type. In other words, when the first conductivity type is n type and the second conductivity type is p type, an n-channel field effect transistor is manufactured, and when the first conductivity type is p type and the second conductivity type is n type, a p-channel field effect transistor is manufactured.

Hereinafter, a method of manufacturing the semiconductor device of FIG. 1 will be discussed, referring to FIGS. 2 to 6.

Figure 2:
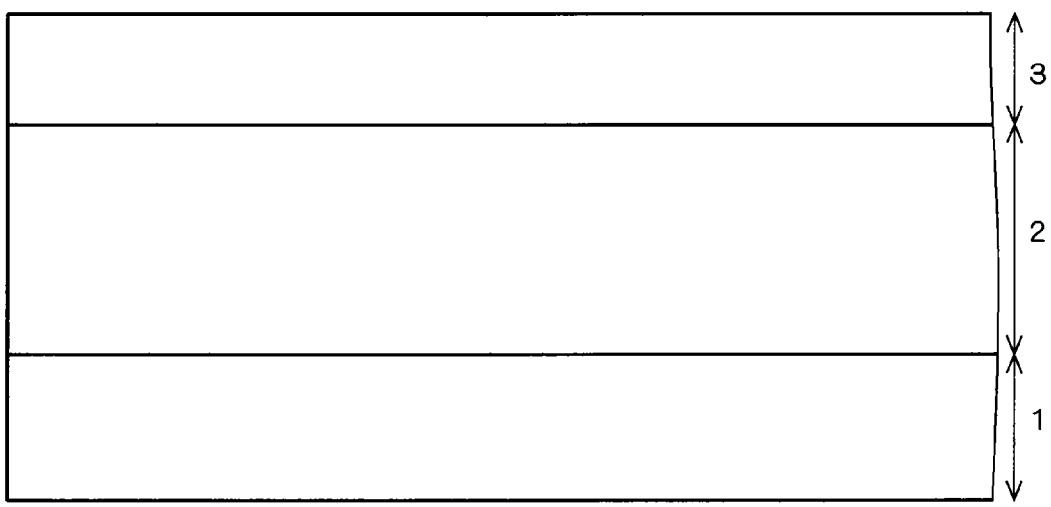
FIG. 2 is a cross section showing a method of manufacturing the semiconductor device in accordance with the first preferred embodiment.

First, as shown in FIG. 2, on the substrate 1 formed of silicon carbide including the first conductivity type impurity, the first drift layer 2 made of silicon carbide including the first conductivity type impurity is formed by the epitaxial crystal growth method. In the first drift layer 2, the thickness only has to be in a range from 5 to 50 μm and the impurity concentration (the first concentration) only has to be in a range from $1 \times 10^{15}$ to $1 \times 10^{18}$ cm$^{-3}$. With setting thus, a vertical field effect transistor having a breakdown voltage ranging from several 100 to 3 kV or more can be achieved. More preferably, the thickness only has to be in a range from 10 to 20 μm and the impurity concentration only has to be in a range from $1\times10^{15}$ to $1\times10^{16}$ cm$^{-3}$.

The substrate 1 may have any plane direction and polytype. Further, it is preferable that the substrate 1 should be doped with the first conductivity type impurity of $1\times10^{18}$ cm$^{-3}$ or more. Furthermore, the step of forming the first drift layer 2 may be omitted by preparing the substrate 1 on which the first drift layer 2 is formed in advance.

Next, the second drift layer 3 made of silicon carbide including the first conductivity type impurity is formed on the first drift layer 2 by the epitaxial crystal growth method. It is preferable that the second drift layer 3 should be formed subsequently to the formation of the first drift layer 2 on the substrate 1. In the second drift layer 3, the thickness only has to be in a range from 0.3 to 1.0 μm and the impurity concentration (the second concentration) only has to be higher than that of the first drift layer 2. By setting thus, it is possible to reduce the resistance of the JFET region 15 in the field effect transistor to be manufactured.

Further, in the second drift layer 3, the first conductivity type impurity may be uniformly distributed or may be distributed higher in the vicinity of the interface with the first drift layer 2, or a multilayer structure consisting of two or more layers having different impurity concentrations of the first conductivity type may be provided.

Next, as shown in FIG. 3, a resist mask (not shown) is selectively formed on the second drift layer 3 except its vicinity of outer peripheral portion by the existing photolithography technique, and then dry etching or wet etching is performed. The region in the vicinity of outer peripheral portion of the second drift layer 3 is thereby removed. In the vicinity of outer peripheral portion, the JTE region 8 of the second conductivity type will be formed in the later step, and by removing the second drift layer 3, it is possible to determine the impurity concentration distribution of the JTE region 8 without being affected by the second drift layer 3 having a relatively higher impurity concentration.

Further, in order to manufacture the element by using the photolithography technique on the substrate 1 formed of silicon carbide, it is necessary to form an alignment marker for photolithography on a predetermined position of the substrate 1, and it is preferable that this marker should be formed by using an etching technique. In other words, by performing the above etching of the second drift layer 3 in the same process as the formation of the marker, it becomes possible to prevent increases in the number of manufacturing process steps and manufacturing cost.

Further, in the end portion of the second drift layer 3 left without being removed, a step portion 16 is formed and it is preferable that this step portion 16 should have a tapered shape. In other words, around the step portion 16, the well region 4a is formed continuously from the end portion of the second drift layer 3 to a portion of the first drift layer 2 below the end portion of the second drift layer 3 by implanting the second conductivity type impurity (ions) in the later step, and with the tapered shape of the step portion 16, it is possible to achieve a gentler distribution of the second conductivity type impurity in the depth direction in the step portion 16. This makes it possible to prevent a decrease in breakdown voltage due to the electric field concentration. Further, with the tapered shape of the step portion 16, it is possible to decrease the possibility of forming a sidewall around the step portion 16 when the epitaxial channel region 10 and the gate electrode 11 are formed in the later step. This reduces the malfunction of the element.

Next, as shown in FIG. 4, resist masks 20 are selectively formed on the first drift layer 2 and the second drift layer 3 by using the existing photolithography technique. This resist mask 20 is not formed in regions to be the well regions 4a and 4b. Then, by implanting the second conductivity type impurity (ions) from above the resist masks 20, the well regions 4a and 4b are selectively formed in the first drift layer 2 and the second drift layer 3. The JFET region 15 is thereby provided in the second drift layer 3 between the well regions 4a and 4b.

This ion implantation is so performed as to form the well region 4a with such depth (e.g., 0.4 to 1.5 μm) as to penetrate the second drift layer 3 and not to penetrate the first drift layer 2. The concentration (third concentration) of the second conductivity type impurity to be implanted into the well regions 4a and 4b is determined (e.g., $1\times10^{17}$ to $1\times10^{19}$ cm$^{-3}$) higher than the concentration of the first conductivity type impurity in the second drift layer 3. Further, it is preferable that the well region 4a should be extended toward the outside of the step portion 16.

Figure 5:
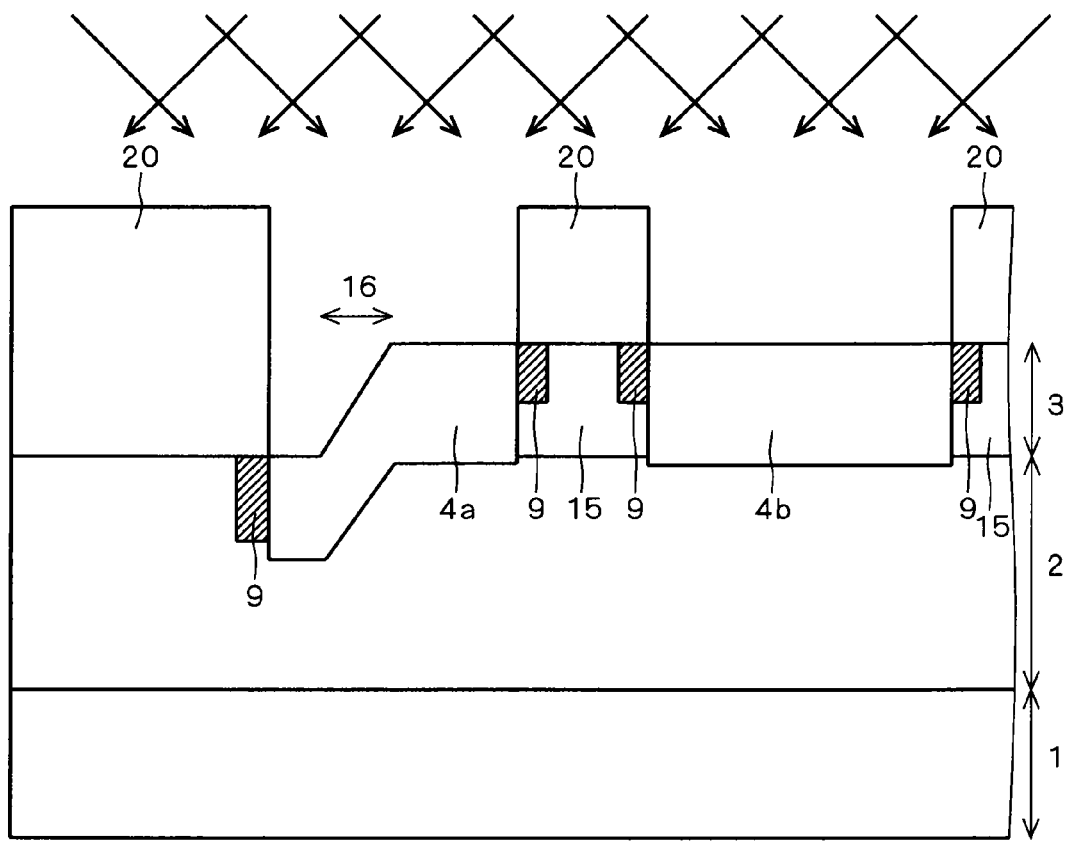
FIG. 5 is a cross section showing a method of manufacturing the semiconductor device in accordance with the first preferred embodiment.

Next, as shown in FIG. 5, without removing the resist masks 20, the first conductivity type impurity (e.g., nitrogen ions or phosphorus ions) is implanted from a direction inclined by a predetermined angle with respect to a vertical direction of the substrate 1, to selectively form the extension regions 9 in the first drift layer 2 and the second drift layer 3. By the self-aligning method using the resist masks 20 used for the formation of the well regions 4, the extension regions 9 with excellent symmetry with respect to the well regions 4 can be formed. Therefore, it is possible to suppress variation of resistances in the element and prevent an increase in manufacturing cost with an additional photolithography step made unnecessary. Further, the extension region 9 may be formed by the existing photolithography technique, not by the self-aligning method.

The extension region 9 is formed with such depth as not to penetrate the JFET region 15 and the well regions 4a and 4b in the vertical direction (in other words, being shallower than the JFET region 15 and the well regions 4a and 4b) and with such width as to prevent coming into contact with the adjacent one with the JFET region 15 interposed therebetween in the transverse direction. In other words, if the extension region 9 penetrates the second drift layer 3 and comes into contact with the first drift layer 2, there is a possibility of increasing an off-leak current of the transistor or decreasing the breakdown voltage, and if the adjacent extension regions 9 are in contact with each other, high electric field is more likely to be applied across the gate insulating film 13 and this causes a possibility of decreasing the breakdown voltage of the transistor and reducing the reliability of the gate insulating film 13, but by forming the extension region 9 to have the above depth and width, it becomes possible to prevent such reduction of reliability.

Further, the concentration (fourth concentration) of the first conductivity type impurity to be implanted into the extension region 9 is set higher than the concentration of the first conductivity type impurity to be implanted into the second drift layer 3 and not higher than the concentration (third concentration) of the second conductivity type impurity in the well regions 4a and 4b. (e.g., $5\times10^{16}$ to $9\times10^{18}$ cm$^{-3}$). By setting the impurity concentration thus, it becomes possible to decrease the resistance in the JFET region 15.

Figure 6:
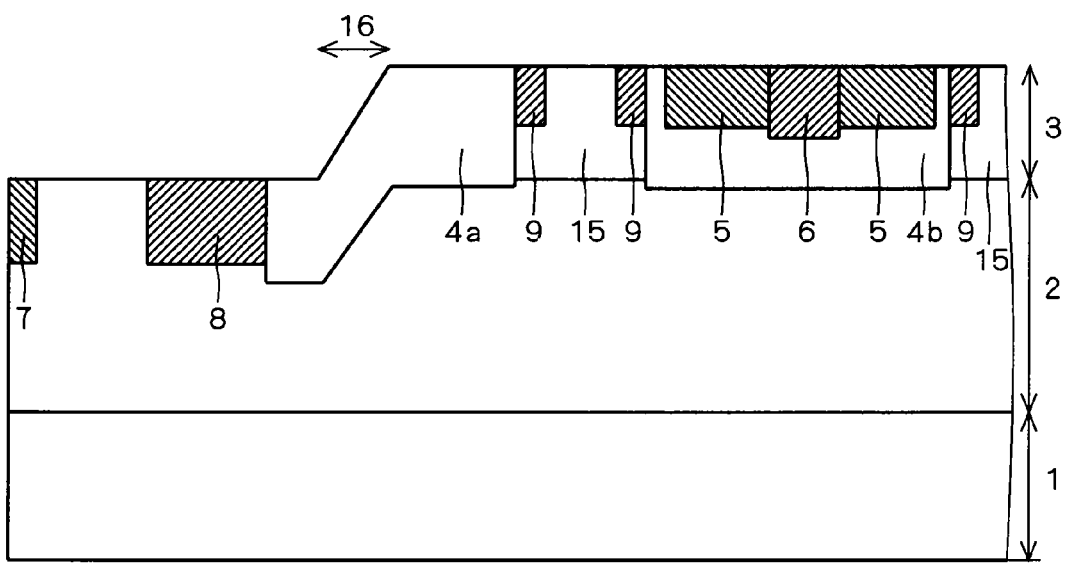
FIG. 6 is a cross section showing a method of manufacturing the semiconductor device in accordance with the first preferred embodiment.

Next, as shown in FIG. 6, the source region 5 of the first conductivity type, the well contact region 6 of the second conductivity type, the JTE region 8 of the second conductivity type and the field stopper region 7 of the first conductivity type are formed by using the existing photolithography technique and the ion implantation technique. The JTE region 8 is so formed as to be adjacent to the well region 4a in a region outside the well region 4a in the first drift layer 2 above which the second drift layer 3 is removed. The field stopper region 7 is so formed away from the JTE region 8 as to come into contact with the outer peripheral portion in the region outside the well region 4a in the first drift layer 2 above which the second drift layer 3 is removed.

The source region 5 is formed with such depth as not to penetrate the well region 4b (e.g., 10 nm to 0.5 μm). The concentration of the first conductivity type impurity in the source region 5 is set higher than the concentration of the second conductivity type impurity in the well regions 4a and 4b (e.g., $1 \times 10^{18}$ to $1 \times 10^{21}$ cm$^{-3}$).

Next, after cleaning the substrate 1, a heat treatment is performed on the substrate 1 by a heat treatment apparatus at high temperature of e.g., 1400 to 1800° C. for e.g., about 30 seconds to 1 hour, to electrically activate the implanted ions. After that, formation of the epitaxial channel region 10, formation of the gate insulating film 13, formation of the gate electrode 11, deposition of an interlayer insulating film, formation of the source electrode 12, formation of the drain electrode 14 and formation of a protection film and so on are sequentially performed by existing methods. This completes the semiconductor device shown in FIG. 1.

Further, as shown in FIG. 1, though the epitaxial channel regions 10 are formed on parts of the well region 4b and the source region 5, the extension region 9 and the JFET region 15, to have a thickness of about 10 to 1000 nm, the epitaxial channel region 10 may not be formed.

Thus, in the semiconductor device and the method of manufacturing the same of the first preferred embodiment, the second drift layer 3 whose impurity concentration is higher than that of the first drift layer 2 is formed on the first drift layer 2 and the JTE region 8 is formed in the second drift layer 3. Therefore, it is possible to reduce the resistance in the JTE region 8.

Further, since the region in the vicinity of outer peripheral portion of the second drift layer 3 is removed, it is possible to appropriately determine the impurity concentration distribution of the JTE region 8 without being affected by the second drift layer 3.

Furthermore, since the extension region 9 whose impurity concentration is higher than that of the second drift layer 3 is so formed as to be adjacent to the JTE region 8, it is possible to reduce the resistance in the JTE region 8.

The Second Preferred Embodiment

In the semiconductor device of the first preferred embodiment, the well regions 4 are formed by implanting the second conductivity type impurity of the third concentration higher than the concentration of the second drift layer 3. But by changing the impurity concentration distributions of the well regions 4 and the second drift layer 3 according to their depths, it becomes possible to change the type of the field effect transistor.

Figure 7:
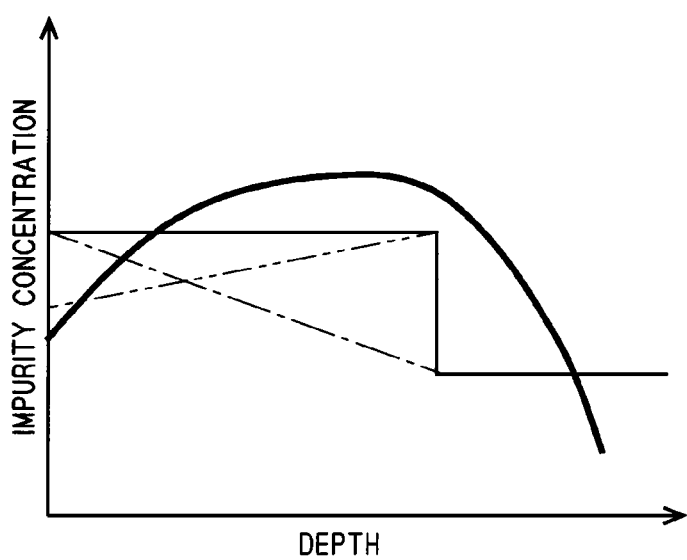
FIG. 7 is a graph showing an impurity concentration distribution in a depth direction of a semiconductor device in accordance with a second preferred embodiment.
Figure 8:
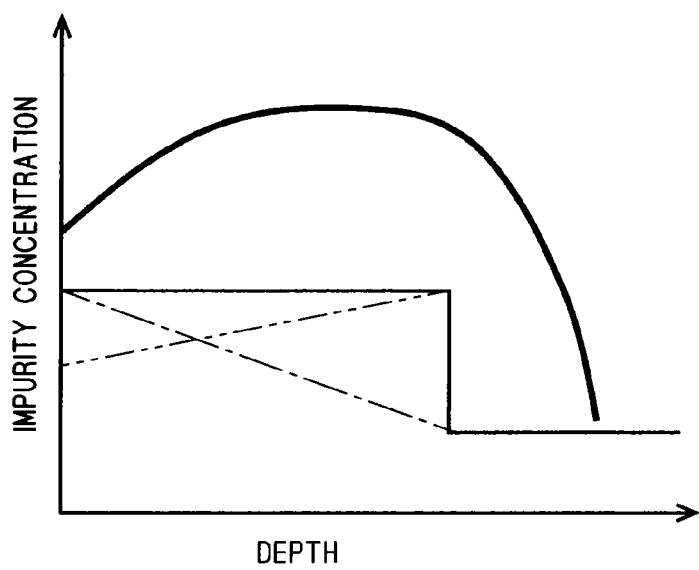
FIG. 8 is a graph showing an impurity concentration distribution in the depth direction of the semiconductor device in accordance with the second preferred embodiment.

FIGS. 7 to 9 are graphs each showing the impurity concentration distribution in the depth direction of the well region 4b in the semiconductor device of FIG. 1. In the well region 4b, a channel region is formed in the vicinity of a surface of a region in which neither the source region 5 nor the well contact region 6 is arranged (i.e., a region between the source region 5 and the extension region 9), and the type of the field effect transistor is changed according to the characteristics of this channel region. FIG. 7 corresponds to a storage field effect transistor, FIG. 8 corresponds to an inverted field effect transistor and FIG. 9 corresponds to a buried field effect transistor.

Figure 10:
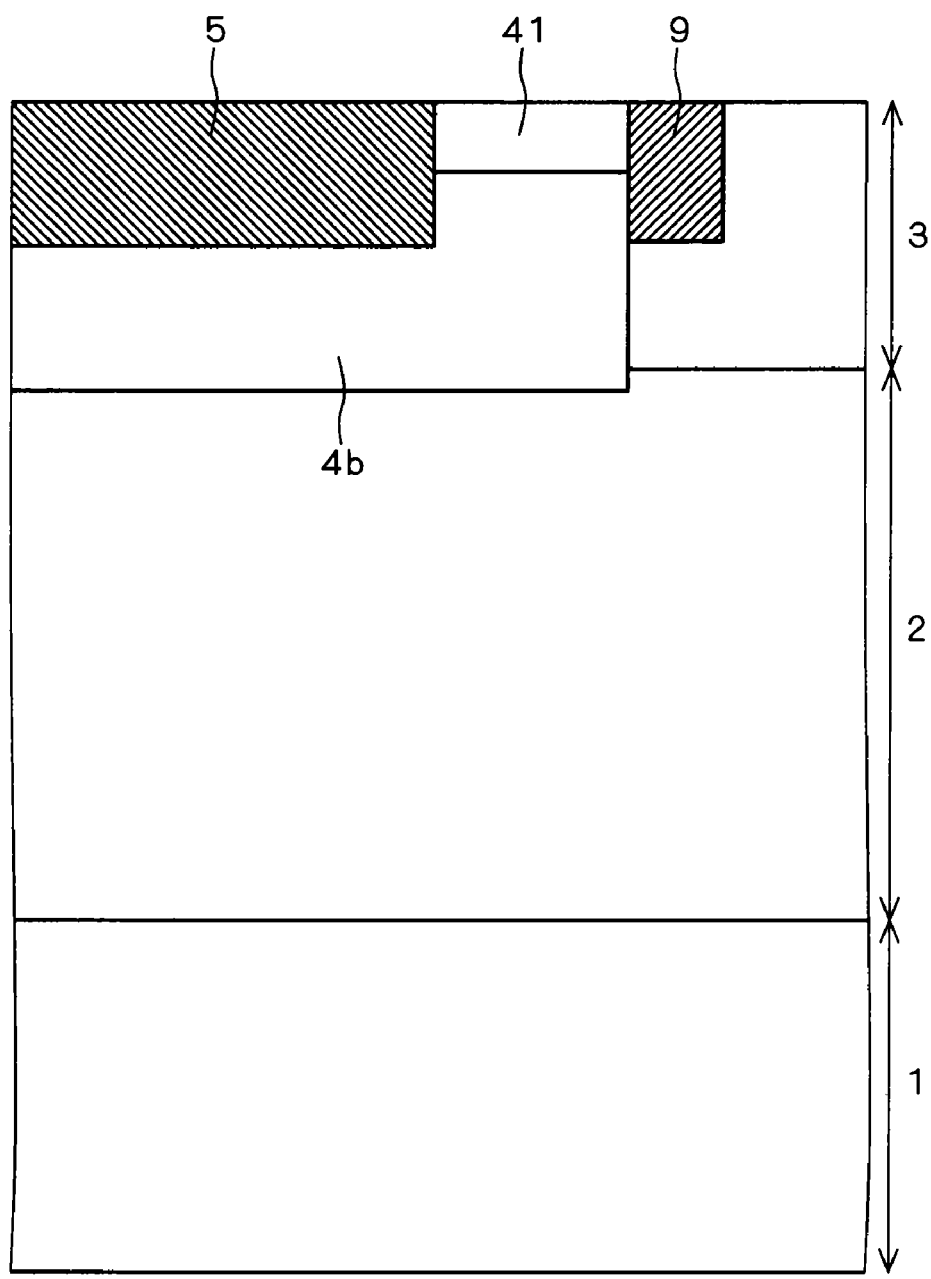
FIG. 10 is a cross section showing a structure of a storage field effect transistor in accordance with the second preferred embodiment.
Figure 11:
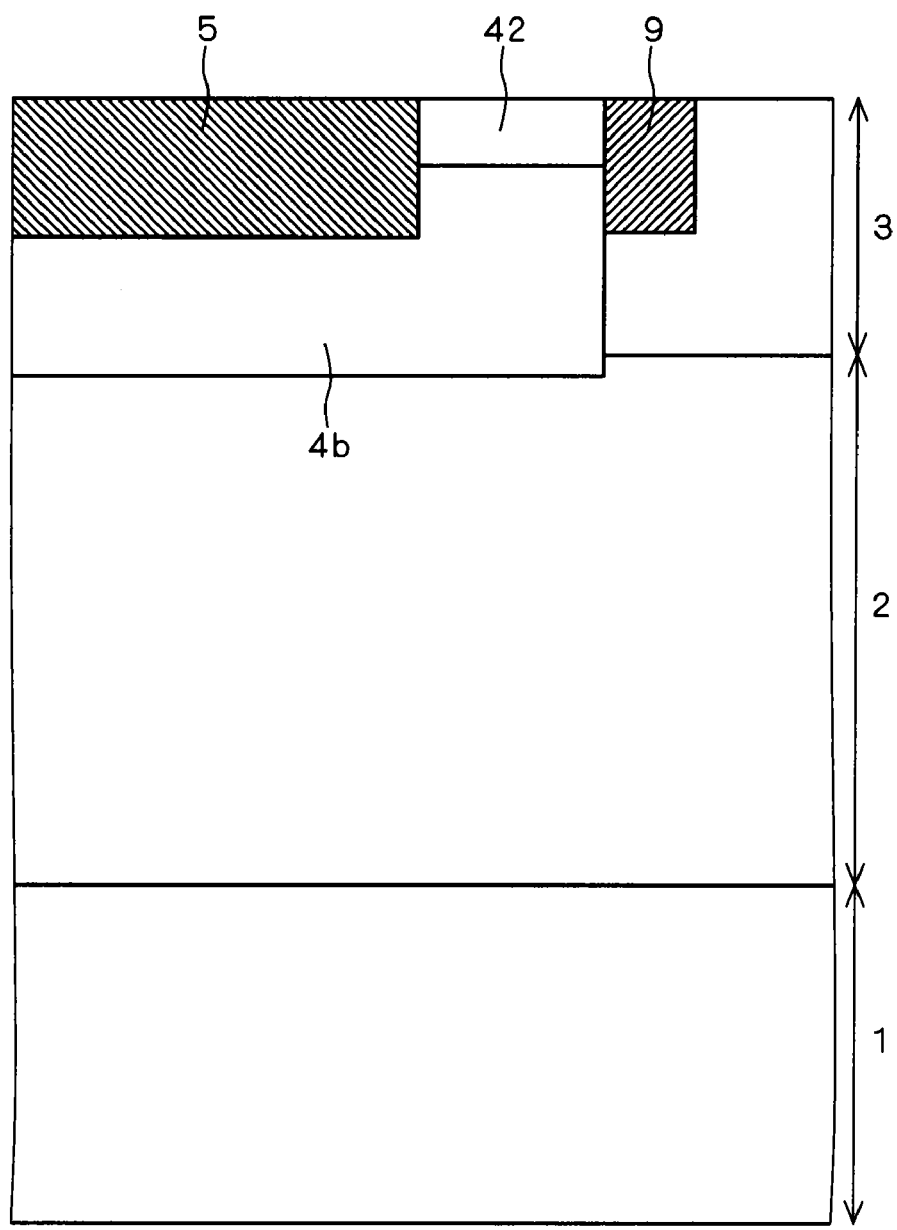
FIG. 11 is a cross section showing a structure of an inverted field effect transistor in accordance with the second preferred embodiment.

FIGS. 10 to 12 are cross sections showing enlarged structures of FIG. 1, correspondingly to FIGS. 7 to 9, and specifically show respective structures of a storage field effect transistor 31, an inverted field effect transistor 32 and a buried field effect transistor 33. In FIGS. 10 to 12, a storage channel region 41, an inverted channel region 42 and a buried channel region 43 are shown, respectively, which are formed in the well region 4b between the source region 5 and the extension region 9 in the semiconductor device of FIG. 1.

In each of FIGS. 7 to 9, the horizontal axis represents the depth of the well region 4b (with respect to a surface of the well region 4b) and the vertical axis represents the impurity concentration. Further, the concentration of the first conductivity type impurity in the first drift layer 2 and the second drift layer 3 is indicated by solid line and the concentration of the second conductivity type impurity to be implanted to form the well region 4 is indicated by thick line. In other words, the conductivity type of the well region 4b is determined by the difference between them.

Though the solid line indicates the case where the impurity concentration in the first drift layer 2 and the second drift layer 3 is uniform regardless of the depth and changes discontinuously at the interface, the change of the impurity concentration is not limited to this case but, for example, the impurity concentration of the second drift layer 3 may change according to the depth as indicated by one-dot chain line or two-dot chain line. In other words, there may be a case indicated by one-dot chain line, where the impurity concentration of the second drift layer 3 becomes lower as it becomes deeper and continuously coincides with that of the first drift layer 2 at the interface, or there may be another case indicated by two-dot chain line, where the impurity concentration of the second drift layer 3 becomes higher as it becomes deeper and discontinuously changes at the interface.

In each of FIGS. 7 to 9, at the depth corresponding to the interface between the first drift layer 2 and the second drift layer 3, the concentration of the impurity to be implanted into the well region 4 is higher than the impurity concentration of the first drift layer 2 and the second drift layer 3.

In FIG. 7, since the concentration of the impurity to be implanted into the well region 4b is lower than the impurity concentration of the second drift layer 3 at the surface of the well region 4b, the channel region 41 has the first conductivity type.

In FIGS. 8 and 9, since the concentration of the impurity to be implanted into the well region 4b is higher than the impurity concentration of the second drift layer 3 at the surface of the well region 4b, the channel region 42 and region 44 have the second conductivity type. The impurity concentration of the well region 4b only has to be in a range from $1 \times 10^{15}$ to $1 \times 10^{17}$ cm$^{-3}$. In FIG. 8, since the impurity concentration of the second drift layer 3 at all the depth is lower than the concentration of the impurity to be implanted into the well region 4, the second drift layer 3 has the second conductivity type at all the depth. On the other hand, in FIG. 9, since the impurity concentration of the second drift layer 3 at some depth is higher than the concentration of the impurity to be implanted into the well region 4, the second drift layer 3 partially has the first conductivity type.

The field effect transistor 31 of FIG. 10 has the storage channel region 41 in the vicinity of the surface of the well region 4b in the second drift layer 3. Since the concentration of the impurity to be implanted into the well region 4b is lower than the impurity concentration of the second drift layer 3 at the surface of the well region 4b, the channel region 41 has the first conductivity type.

The field effect transistor 32 of FIG. 11 has the inverted channel region 42 in the vicinity of the surface of the well region 4b in the second drift layer 3. Since the concentration of the impurity to be implanted into the well region 4b is higher than the impurity concentration of the second drift layer 3 at the surface of the well region 4b, the channel region 42 has the second conductivity type.

The field effect transistor 33 of FIG. 12 has a region 44 in the vicinity of the surface of the well region 4b in the second drift layer 3 and has the buried channel region 43 below the region 44. Since the concentration of the impurity to be implanted into the well region 4b is higher than the impurity concentration of the second drift layer 3 at the surface of the well region 4b and is lower than the impurity concentration of the second drift layer 3 in a slightly deeper portion from the surface, the region 44 has the second conductivity type and the channel region 43 has the first conductivity type.

Thus, in the semiconductor device and the method of manufacturing the same of the second preferred embodiment, by changing the impurity concentration distributions of the well region 4b and the second drift layer 3 according to the depth, the channel structure (transistor structure) is changed to change the threshold value and the ON-resistance. Therefore, it becomes possible to easily manufacture various field effect transistors according to uses without adding any particular process.

Further, in the field effect transistor 31 of FIG. 10 and the field effect transistor 32 of FIG. 12, since the conductivity types are inverted in the vicinity of the surface of the well region 4b, it is possible to increase the channel mobility and decrease the ON-resistance.

Furthermore, since the field effect transistor 31 of FIG. 10 has the first conductivity type in the vicinity of the surface of the well region 4b, it is possible to reduce the threshold voltage.

While the invention has been shown and described in detail, the foregoing description is in all aspects illustrative and not restrictive. It is therefore understood that numerous modifications and variations which are not shown can be devised without departing from the scope of the invention.

The invention claimed is:

1. A semiconductor device comprising:
a substrate formed of silicon carbide including a first conductivity type impurity;
a first drift layer formed of silicon carbide including a first conductivity type impurity of first concentration, being disposed entirely on a surface of said substrate;
a second drift layer formed of silicon carbide including a first conductivity type impurity of second concentration higher than said first concentration, being disposed on a surface of said first drift layer;
a plurality of well regions containing a second conductivity type impurity, being disposed in said second drift layer;
a current control region disposed in second drift layer between a pair of said well regions;
a gate electrode disposed above said current control region; and
a gate insulating film disposed between said gate electrode and said current control region, wherein the concentration of the first conductivity type impurity of said second drift layer varies in a region having a depth no greater than a depth of said well region from a surface of said second drift layer in accordance with the depth from said surface of said second drift layer, said depth comprising the distance from said gate electrode, and
wherein said region in which the concentration of the first conductivity type impurity of said second drift layer varies includes a region in said well region in which a channel is formed.

2. The semiconductor device according to claim 1, wherein the concentration of the first conductivity type impurity of said second drift layer becomes lower as said depth increases and continuously coincides with the concentration of the first conductivity type impurity of said first drift layer at an interface with said first drift layer.

3. The semiconductor device according to claim 1, wherein the concentration of the first conductivity type impurity of said second drift layer becomes higher as said depth increases, and
the concentrations of the first conductivity type impurity of said first and second drift layers discontinuously change at an interface between said first and second drift layers.

4. The semiconductor device according to claim 1, wherein the concentration of the second conductivity type impurity implanted into said well regions is lower than the concentration of the first conductivity type impurity of said second drift layer at a surface portion of said well region.

5. The semiconductor device according to claim 1, wherein the concentration of the second conductivity type impurity implanted into said well regions is higher than the concentration of the first conductivity type impurity of said second drift layer at a surface portion of said well region.

6. The semiconductor device according to claim 1, wherein said second drift layer is disposed entirely on a surface of said first drift layer except its vicinity of outer peripheral portion, and
a step portion at an end portion adjacent to said vicinity of outer peripheral portion of said second drift layer has a tapered shape.

7. The semiconductor device according to claim 6, wherein said plurality of well regions includes
a first well region disposed continuously from the end portion adjacent to said vicinity of outer peripheral portion of said second drift layer to a portion of said first drift layer below said vicinity of outer peripheral portion; and
a second well region disposed in said second drift layer except the end portion adjacent to said vicinity of outer peripheral portion, and
said first well region is extended toward the outside of said step portion.

8. The semiconductor device according to claim 1, further comprising
an extension region containing a first conductivity type impurity having a concentration higher than said second concentration, being disposed at each of respective interfaces between said current control region and said well regions in a surface of said second drift layer.

9. The semiconductor device according to claim 8, wherein said extension region is shallower than said well regions and said current control region.

* * * * *